(12) United States Patent
Lee et al.

(10) Patent No.: US 8,659,333 B2
(45) Date of Patent: Feb. 25, 2014

(54) VOLTAGE GENERATION CIRCUIT OF SEMICONDUCTOR MEMORY APPARATUS

(75) Inventors: Kang Seol Lee, Gyeonggi-do (KR); Jae Hyuk Im, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,270

(22) Filed: Sep. 3, 2012

(65) Prior Publication Data
US 2013/0234765 A1  Sep. 12, 2013

(30) Foreign Application Priority Data
Oct. 20, 2011  (KR) .................. 10-2011-0107637

(51) Int. Cl.
*H03L 7/06* (2006.01)

(52) U.S. Cl.
USPC .............................. 327/157; 327/536; 363/59

(58) Field of Classification Search
USPC ................. 327/148, 157, 536; 363/59, 60
See application file for complete search history.

(56) References Cited

U.S. PATENT DOCUMENTS

| | | | | |
|---|---|---|---|---|
| 5,959,854 A | * | 9/1999 | Okada | 363/60 |
| 5,982,222 A | * | 11/1999 | Kyung | 327/536 |
| 8,493,134 B2 | * | 7/2013 | Hao et al. | 327/536 |
| 2008/0284496 A1 | * | 11/2008 | Ha et al. | 327/536 |

* cited by examiner

*Primary Examiner* — William Hernandez
(74) *Attorney, Agent, or Firm* — William Park & Associates Patent Ltd.

(57) ABSTRACT

A voltage generation circuit of a semiconductor memory apparatus includes a plurality of pumping units configured to provide voltages to an output node; a sensing unit configured to sense a voltage level of the output node and generate a pumping enable signal; an oscillator configured to generate an oscillator signal in response to the pumping enable signal; and a control unit configured to selectively output the oscillator signal to the plurality of pumping units in response to an active signal, a power-up signal and a mode register set signal.

3 Claims, 4 Drawing Sheets

VOLTAGE GENERATION CIRCUIT OF SEMICONDUCTOR MEMORY APPARATUS

CROSS-REFERENCES TO RELATED APPLICATION

The present application claims priority under 35 U.S.C. §119(a) to Korean application number 10-2011-0107637, filed on Oct. 20, 2011, in the Korean Intellectual Property Office, which is incorporated herein by reference in its entirety.

BACKGROUND

1. Technical Field

The present invention relates generally to a semiconductor memory apparatus and to a circuit for generating a voltage in a semiconductor memory apparatus.

2. Related Art

In general, a semiconductor memory apparatus operates by being applied with a voltage from an outside. In detail, a semiconductor memory apparatus is applied with an external voltage from an outside, internally generates an internal voltage, and operates using the external voltage and the internal voltage.

FIG. 1 is a diagram showing a transistor used in a cell array region, among transistors constituting a semiconductor memory apparatus.

The transistor illustrated in FIG. 1 has a gate which with a control signal CTRL, a drain which is applied with a pumping voltage VPP and a source which is applied with a ground voltage VSS, and is applied with a negative voltage VBB as a back bias voltage. The pumping voltage VPP and the negative voltage VBB are internal voltages which are generated in the semiconductor memory apparatus.

The pumping voltage VPP has a target level of a positive voltage level, and the negative voltage VBB has a target level of a negative voltage level. Therefore, after an external voltage is initially applied to the semiconductor memory apparatus, the voltage level of the pumping voltage VPP is raised to the target level of the positive voltage level, and the voltage level of the negative voltage VBB is lowered to the target level of the negative voltage level.

In the quest for the pumping voltage VPP and the negative voltage VBB to initially reach the target levels, due to a coupling characteristic between the drain and a back bias terminal, a level rise of the pumping voltage VPP applied to the drain of the transistor impedes the negative voltage VBB applied to the back bias terminal of the transistor from reaching its target level.

If the level of the pumping voltage VPP applied to the drain is raised in the situation where the negative voltage VBB used as the back bias voltage of the transistor does not reach its target level, leakage current flows between the drain and the source of the transistor.

As a consequence, in the transistor illustrated in FIG. 1, which is generally used in the cell array region, leakage current flows due to the pumping voltage VPP and the negative voltage VBB not having reached their target levels, which serves as a factor that increases current consumption of the semiconductor memory apparatus.

SUMMARY

In an embodiment, a voltage generation circuit of a semiconductor memory apparatus includes: a plurality of pumping units configured to provide voltages to an output node; a sensing unit configured to sense a voltage level of the output node and generate a pumping enable signal; an oscillator configured to generate an oscillator signal in response to the pumping enable signal; and a control unit configured to selectively output the oscillator signal to the plurality of pumping units in response to an active signal, a power-up signal and a mode register set signal.

In an embodiment, a voltage generation circuit of a semiconductor memory apparatus includes: a sensing unit configured to sense a voltage level of an output node and generate a pumping enable signal; an oscillator configured to generate an oscillator signal in response to the pumping enable signal; a first standby pumping unit configured to perform a pumping operation in response to the oscillator signal, and output a voltage generated by the pumping operation, to the output node; a second standby pumping unit configured to perform a pumping operation in response to the oscillator signal when a mode register set signal is enabled, and output a voltage generated by the pumping operation, to the output node; and an active pumping unit configured to perform a pumping operation in response to the oscillator signal when an active signal is enabled, and output a voltage generated by the pumping operation, to the output node.

BRIEF DESCRIPTION OF THE DRAWINGS

Features, aspects, and embodiments are described in conjunction with the attached drawings, in which.

DETAILED DESCRIPTION

Figure 1:
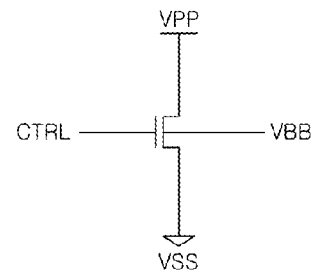
FIG. 1 is a view illustrating a conventional semiconductor memory apparatus.

Hereinafter, a voltage generation circuit of a semiconductor memory apparatus according to various embodiments will be described below with reference to the accompanying drawings. The same reference numerals or the same reference designators denote the same elements throughout the specification.

Figure 2:
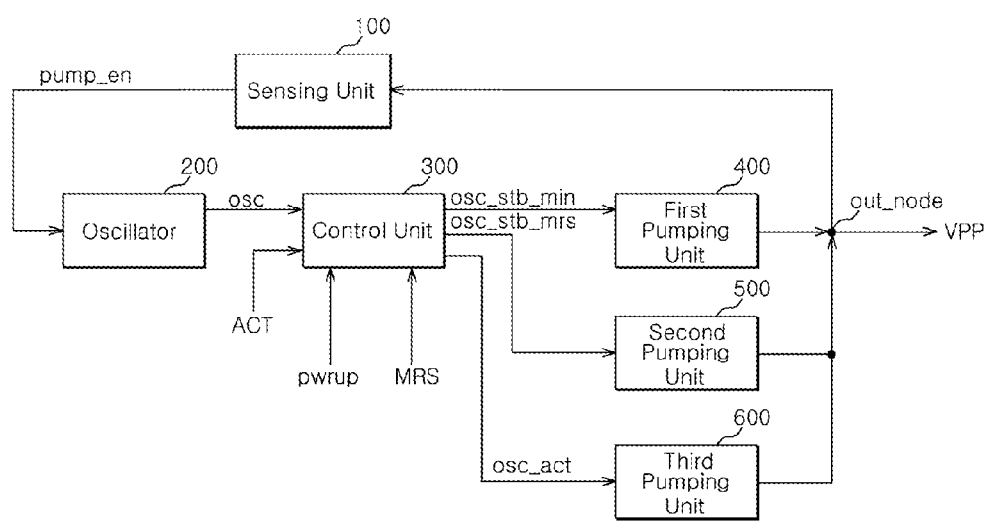
FIG. 2 is a configuration diagram schematically illustrating a voltage generation circuit of a semiconductor memory apparatus in accordance with an embodiment.

Referring to FIG. 2, a voltage generation circuit of a semiconductor memory apparatus in accordance with an embodiment may include a sensing unit 100, an oscillator 200, a control unit 300, and first to third pumping units 400, 500, and 600, respectively.

The sensing unit 100 may be configured to sense the voltage level of an output node out_node and generate a pumping enable signal pump_en. For example, the sensing unit 100 may enable the pumping enable signal pump_en when the voltage level of the output node out_node is equal to or lower than a preset voltage level, and may disable the pumping enable signal pump_en when the voltage level of the output node out_node is equal to or higher than the preset voltage level.

The oscillator 200 may be configured to generate an oscillator signal osc in response to the pumping enable signal pump_en. For example, the oscillator 200 may generate the oscillator signal osc of a preset cycle when the pumping enable signal pump_en is enabled, and may generate the oscillator signal osc locked to a predetermined level when the pumping enable signal pump_en is disabled.

The control unit 300 may be configured to selectively output the oscillator signal osc to the first to third pumping units 400, 500 and 600 in response to an active signal ACT, a power-up signal pwrup, and a mode register set signal MRS. For example, the control unit 300 may output the oscillator signal osc to a preset number of pumping units when the power-up signal pwrup is enabled, output the oscillator signal osc to an increased number of pumping units that is larger than the preset number when the mode register set signal MRS is enabled, and output the oscillator signal osc to all pumping units when the active signal ACT is enabled. Additionally, the control unit 300 may output the oscillator signal osc only to the first pumping unit 400 among the first to third pumping units 400, 500 and 600 when the power-up signal pwrup is enabled. The control unit 300 may output the oscillator signal osc to the first and second pumping units 400 and 500 among the first to third pumping units 400, 500 and 600 when the mode register set signal MRS is enabled. The controller 300 may output the oscillator signal osc to all the first to third pumping units 400, 500 and 600 when the active signal ACT is enabled.

The control unit 300 may output the oscillator signal osc as a first standby oscillator signal osc_stb_min when the power-up signal pwrup is enabled among the power-up signal pwrup, the mode register set signal MRS, and the active signal ACT. The first standby oscillator signal osc_stb_min may be inputted to the first pumping unit 400.

The control unit 300 may output the oscillator signal osc as the first standby oscillator signal osc_stb_min and a second standby oscillator signal osc_stb_mrs when the mode register set signal MRS is enabled after the power-up signal pwrup is enabled. The first standby oscillator signal osc_stb_min may be inputted to the first pumping unit 400, and the second standby oscillator signal osc_stb_mrs may be inputted to the second pumping unit 500.

The control unit 300 may output the oscillator signal osc as the first and second standby oscillator signals osc_stb_min and osc_stb_mrs, respectively, and an active oscillator signal osc_act when the active signal ACT is enabled after the power-up signal pwrup and the mode register set signal MRS are enabled. The first and second standby oscillator signals osc_stb_min and osc_stb_mrs are respectively inputted to the first and second pumping units 400 and 500, respectively, and the active oscillator signal osc_act may be inputted to the third pumping unit 600. The respective output terminals of the first to third pumping units 400, 500, and 600, respectively, are commonly connected to the output node out_node, and the voltage of the output node out_node is outputted as a pumping voltage VPP.

The first pumping unit 400 may be configured to perform a pumping operation in response to the first standby oscillator signal osc_stb_min and output the voltage generated as a result of the pumping operation to the output node out_node.

The second pumping unit 500 may be configured to perform a pumping operation in response to the second standby oscillator signal osc_stb_mrs and output the voltage generated as a result of the pumping operation to the output node out_node.

The third pumping unit 600 may be configured to perform a pumping operation in response to the active oscillator signal osc_act and output the voltage generated as a result of the pumping operation to the output node out_node.

Figure 3:
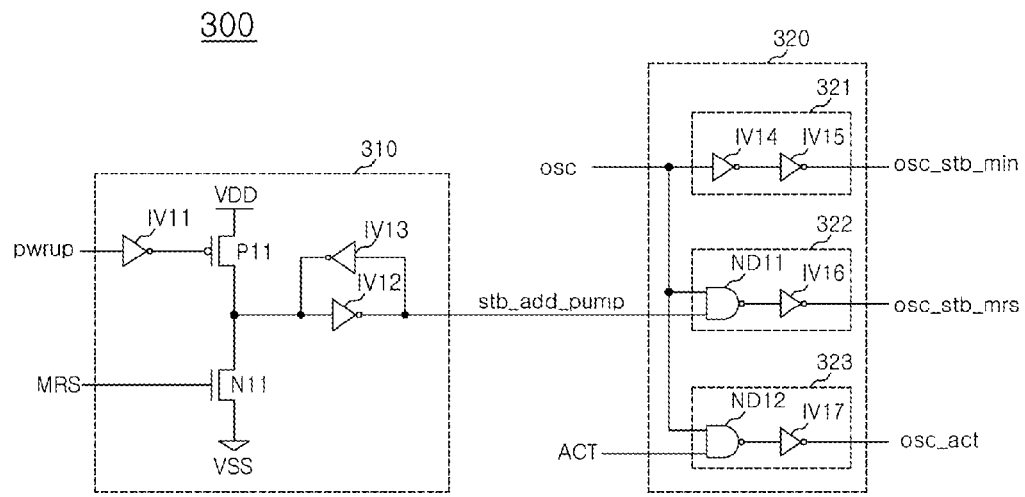
FIG. 3 is a configuration diagram illustrating the control unit illustrated in FIG. 2.

Referring to FIG. 3, the control unit 300 may include a signal generating section 310, and an oscillator signal selective output section 320.

The signal generating section 310 may be configured to disable a standby pump adding signal stb_add_pump when the power-up signal pwrup is enabled and enable the standby pump adding signal stb_add_pump when the mode register set signal MRS is enabled. The enabled mode register set signal MRS maintains the enabled state.

The signal generating section 310 may include first to third inverters IV11 to IV13, respectively, and first and second transistors P11 and N11, respectively. The first inverter IV11 may be inputted with the power-up signal pwrup. The first transistor P11 has a gate which may be inputted with the output signal of the first inverter IV11 and a source which is applied with an external voltage VDD. The second transistor N11 has a gate which may be inputted with the mode register set signal MRS, a drain to which the drain of the first transistor P11 may be connected, and a source to which a ground terminal VSS may be connected. The second inverter IV12 has an input terminal to which a node connected with the first and second transistors P11 and N11, respectively may be connected, and an output terminal from which the standby pump adding signal stb_add_pump may be outputted. The third inverter IV13 may be inputted with the output signal of the second inverter IV12 and may output it as an input signal of the second inverter IV12.

The oscillator signal selective output section 320 may include first to third drivers 321 to 323, respectively.

The first driver 321 may be configured to be inputted with the oscillator signal osc and output the first standby oscillator signal osc_stb_min.

The first driver 321 may include fourth and fifth inverters IV14 and IV15, respectively. The fourth inverter IV14 may be inputted with the oscillator signal osc. The fifth inverter IV15 may be inputted with the output signal of the fourth inverter IV14 and may output the first standby oscillator signal osc_stb_min.

The second driver 322 may be configured to output the oscillator signal osc as the second standby oscillator signal osc_stb_mrs when the standby pump adding signal stb_add_pump is enabled.

The second driver 322 may include a first NAND gate ND11 and a sixth inverter IV16. The first NAND gate ND11 may be inputted with the oscillator signal osc and the standby pump adding signal stb_add_pump. The sixth inverter IV16 may be inputted with the output signal of the first NAND gate ND11 and may output the second standby oscillator signal osc_stb_mrs.

The third driver 323 may be configured to output the oscillator signal osc as the active oscillator signal osc_act when the active signal ACT is enabled.

The third driver 323 may include a second NAND gate ND12 and a seventh inverter IV17. The second NAND gate ND12 may be inputted with the oscillator signal osc and the active signal ACT. The seventh inverter IV17 may be inputted with the output signal of the second NAND gate ND12 and may output the active oscillator signal osc_act.

The voltage generation circuit of a semiconductor memory apparatus in accordance with an embodiment, configured as mentioned above, may operate as described below.

As an external voltage is initially applied to the semiconductor memory apparatus, the power-up signal pwrup may be enabled after a predetermined time.

If the power-up signal pwrup is enabled, the sensing unit 100 and the oscillator 200 may start to operate.

The oscillator signal osc as the output of the oscillator 200 may be inputted to the first pumping unit 400 as the first standby oscillator signal osc_stb_min.

Only the first pumping unit 400 among the first pumping unit 400, the second pumping unit 500 and the third pumping unit 600 may perform a pumping operation and may output a voltage generated by the pumping operation, to the output node out_node.

After the power-up signal pwrup is enabled, a mode register set, which may be configured to set modes of the semiconductor memory apparatus, may enable the mode register set signal MRS.

If the mode register set signal MRS is enabled, the standby pump adding signal stb_add_pump may be enabled. The enabled standby pump adding signal stb_add_pump may maintain the enabled state.

If the standby pump adding signal stb_add_pump is enabled, the oscillator signal osc may be outputted as the second standby oscillator signal osc_stb_mrs.

As a result, if the power-up signal pwrup and the mode register set signal MRS are enabled, the oscillator signal osc may be outputted as the first and second standby oscillator signals osc_stb_min and osc_stb_mrs, respectively. The first and second pumping units 400 and 500 which are inputted with the first and second standby oscillator signals osc_stb_min and osc_stb_mrs, respectively, may perform pumping operations, and may output voltages generated by the pumping operations, to the output node out_node.

After the power-up signal pwrup and the mode register set signal MRS are enabled, the active signal ACT for activating the semiconductor memory apparatus, for example, a bank, may be enabled.

If the active signal ACT is enabled after the power-up signal pwrup and the mode register set signal MRS are enabled, the oscillator signal osc may be outputted as the first and second standby oscillator signals osc_stb_min and osc_stb_mrs, respectively, and the active oscillator signal osc_act. The first to third pumping units 400, 500 and 600, respectively, which are respectively inputted with the first and second standby oscillator signals osc_stb_min and osc_stb_mrs and the active oscillator signal osc_act may perform pumping operations, and may output voltages generated by the pumping operations, to the output node out_node.

In the voltage generation circuit of a semiconductor memory apparatus in accordance with an embodiment, if the power-up signal pwrup is enabled, only the first pumping unit 400 may perform the pumping operation. If the mode register set signal MRS is enabled after the power-up signal pwrup is enabled, the first and second pumping units 400 and 500 may perform the pumping operations. If the active signal ACT is enabled after the power-up signal pwrup and the mode register set signal MRS are enabled, all the first to third pumping units 400, 500 and 600, respectively, may perform the pumping operations.

While it was described in the voltage generation circuit of a semiconductor memory apparatus in accordance with an embodiment that only one pumping unit 400 may perform the pumping operation when the power-up signal pwrup is enabled before the mode register set signal MRS is enabled, it is to be noted that it belongs to a simple design change to a person skilled in the art to make a modification such that a preset number of (a minimum number of) pumping units may perform pumping operations when the power-up signal pwrup is enabled before the mode register set signal MRS is enabled.

The voltage generation circuit of a semiconductor memory apparatus in accordance with an embodiment may be configured such that a minimum number of pumping units perform pumping operations when the power-up signal pwrup is enabled before the mode register set signal MRS is enabled, an increased number of pumping units that is larger than the minimum number perform pumping operations after the mode register set signal MRS is enabled, and a maximum number of pumping units perform pumping operations when the active signal ACT is enabled after the mode register set signal MRS is enabled.

Therefore, in the voltage generation circuit of a semiconductor memory apparatus in accordance with an embodiment, a minimum number of pumping units perform pumping operations and generate pumping voltages after the power-up signal pwrup is enabled before the mode register set signal MRS is enabled. Thus, in the transistor configured as illustrated in FIG. 1, a coupling characteristic between the drain applied with the pumping voltage VPP and the back bias terminal applied with the negative voltage VBB (a characteristic that the level of the negative voltage VBB rises due to rise of the pumping voltage VPP) may be suppressed, whereby the leakage current of the transistor may be reduced.

As a consequence, in the voltage generation circuit of a semiconductor memory apparatus in accordance with an embodiment of the present invention, the leakage current of a transistor may be reduced and current consumption of a semiconductor memory apparatus may be decreased. Further, as a characteristic that the level of the negative voltage VBB rises due to coupling with the pumping voltage VPP is suppressed, an amount of current needed to generate the negative voltage VBB may be decreased.

Figure 4:
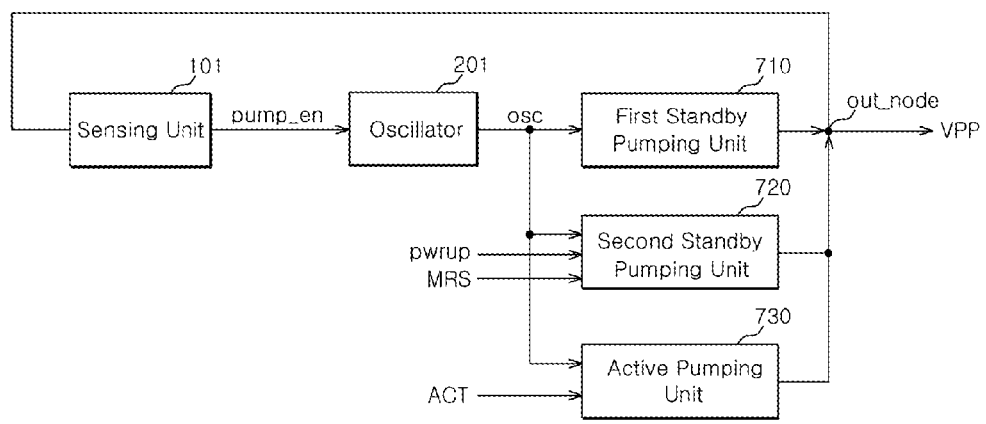
FIG. 4 is a configuration diagram schematically illustrating a voltage generation circuit of a semiconductor memory apparatus in accordance with an embodiment.

Referring to FIG. 4, a voltage generation circuit of a semiconductor memory apparatus in accordance with an embodiment may include a sensing unit 101, an oscillator 201, first and second standby pumping units 710 and 720, respectively, and an active pumping unit 730.

The sensing unit 101 may be configured to sense the voltage level of an output node out_node and may generate a pumping enable signal pump_en. For example, the sensing unit 100 may enable the pumping enable signal pump_en when the voltage level of the output node out_node is equal to or lower than a preset voltage level, and may disable the pumping enable signal pump_en when the voltage level of the output node out_node is equal to or higher than the preset voltage level.

The oscillator 201 may be configured to generate an oscillator signal osc in response to the pumping enable signal pump_en. For example, the oscillator 201 may generate the oscillator signal osc of a preset cycle when the pumping enable signal pump_en is enabled, and may generate the oscillator signal osc locked to a predetermined level when the pumping enable signal pump_en is disabled.

The first standby pumping unit 710 may be configured to perform a pumping operation in response to the oscillator signal osc and output the voltage generated as a result of the pumping operation to the output node out_node.

Figure 5:
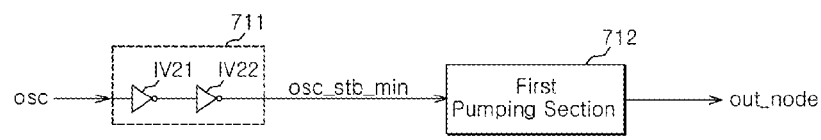
FIG. 5 is a configuration diagram illustrating the first standby pumping unit of FIG. 4.

Referring to FIG. 5, the first standby pumping unit 710 may include a first driver 711 and a first pumping section 712.

The first driver 711 may be configured to output the oscillator signal osc as a first standby oscillator signal osc_stb_min.

The first driver 711 may include first and second inverters IV21 and IV22, respectively. The first inverter IV21 may be inputted with the oscillator signal osc. The second inverter IV22 may be inputted with the output signal of the first inverter IV21 and may output the first standby oscillator signal osc_stb_min.

The first pumping section 712 may be configured to perform a pumping operation in response to the first standby oscillator signal osc_stb_min and may output the voltage generated as a result of the pumping operation to the output node out_node.

The second standby pumping unit 720 may be configured to perform a pumping operation in response to the oscillator signal osc when a mode register set signal MRS is enabled and may output the voltage generated as a result of the pumping operation to the output node out_node. For example, the second standby pumping unit 720 may interrupt the pumping operation from a time when a power-up signal pwrup is enabled to a time when the mode register set signal MRS is enabled, and may perform the pumping operation in response to the oscillator signal osc when the mode register set signal MRS is enabled.

Figure 6:
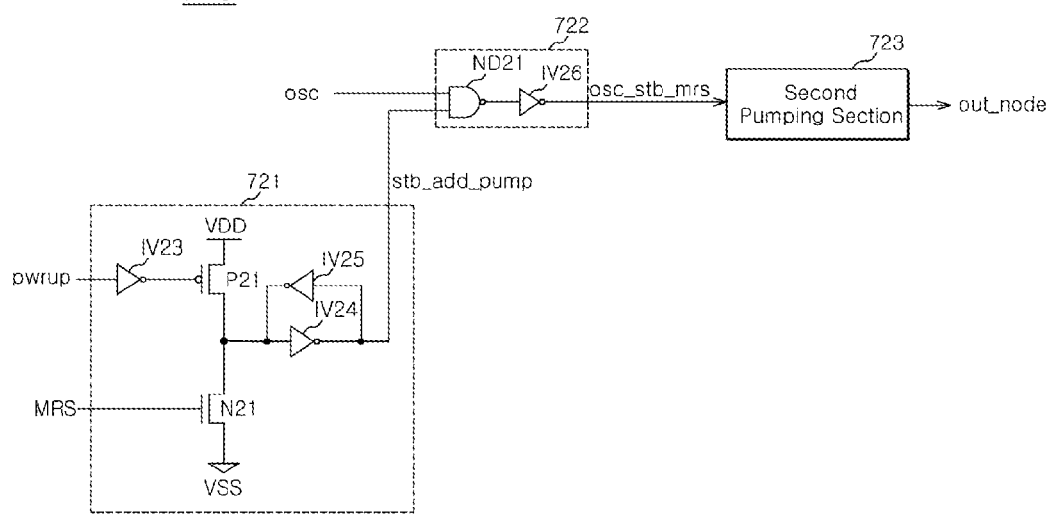
FIG. 6 is a configuration diagram illustrating the second standby pumping unit of FIG. 4.

Referring to FIG. 6, the second standby pumping unit 720 may include a signal generating section 721, a first signal combining section 722, and a second pumping section 723.

The signal generating section 721 may be configured to disable a standby pump adding signal stb_add_pump when the power-up signal pwrup is enabled and may enable the standby pump adding signal stb_add_pump when the mode register set signal MRS is enabled. The enabled standby pump adding signal stb_add_pump may maintain the enabled state.

The signal generating section 721 may include third to fifth inverters IV23 to IV25, respectively, and first and second transistors P21 and N21, respectively. The third inverter IV23 may be inputted with the power-up signal pwrup. The first transistor P21 has a gate which may be inputted with the output signal of the third inverter IV23, and a source which may be applied with an external voltage VDD. The second transistor N21 has a gate which may be inputted with the mode register set signal MRS, a drain to which the drain of the first transistor P21 may be connected, and a source to which a ground terminal VSS may be connected. The fourth transistor IV24 has an input terminal to which a node connected with the first and second transistors P21 and N21, respectively, may be connected, and an output terminal which may output the standby pump adding signal stb_add_pump. The fifth inverter IV25 may be inputted with the output signal of the fourth inverter IV24 and may output it as an input signal of the fourth inverter IV24.

The first signal combining section 722 may be configured to output the oscillator signal osc as a second standby oscillator signal osc_stb_mrs when the standby pump adding signal stb_add_pump is enabled. Meanwhile, the first signal combining section 722 locks the second standby oscillator signal osc_stb_mrs to a specified level when the standby pump adding signal stb_add_pump is disabled.

The first signal combining section 722 may include a first NAND gate ND21 and a sixth inverter IV26. The first NAND gate ND21 may be inputted with the standby pump adding signal stb_add_pump and the oscillator signal osc. The sixth inverter IV26 may be inputted with the output signal of the first NAND gate ND21 and may output the second standby oscillator signal osc_stb_mrs.

The second pumping section 723 may be configured to perform a pumping operation in response to the second standby oscillator signal osc_stb_mrs and output the voltage generated as a result of the pumping operation to the output node out_node. The second pumping section 723 may interrupt the pumping operation when the second standby oscillator signal osc_stb_mrs is locked to the specified level.

Figure 7:
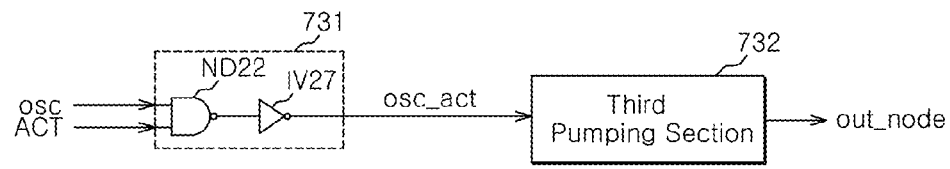
FIG. 7 is a configuration diagram illustrating the active pumping unit of FIG. 4.

Referring to FIG. 7, the active pumping unit 730 may be configured to perform a pumping operation in response to the oscillator signal osc when an active signal ACT is enabled and may output the voltage generated as a result of the pumping operation to the output node out_node.

The active pumping unit 730 may include a second signal combining section 731 and a third pumping section 732.

The second signal combining section 731 may be configured to output the oscillator signal osc as an active oscillator signal osc_act when the active signal ACT is enabled. Additionally, the second signal combining section 731 may lock the active oscillator signal osc_act to a specified level when the active signal ACT is disabled.

The second signal combining section 731 may include a second NAND gate ND22 and a seventh inverter IV27. The second NAND gate ND22 may be inputted with the active signal ACT and the oscillator signal osc. The seventh inverter IV27 may be inputted with the output signal of the second NAND gate ND22 and may output the active oscillator signal osc_act.

The third pumping section 732 may be configured to perform a pumping operation in response to the active oscillator signal osc_act and may output the voltage generated as a result of the pumping operation to the output node out_node. The third pumping section 732 may interrupt the pumping operation when the active oscillator signal osc_act is locked to the specified level.

While it was described in the voltage generation circuit of a semiconductor memory apparatus in accordance with an embodiment that only one standby pumping unit 710 performs the pumping operation when the power-up signal pwrup is enabled before the mode register set signal MRS is enabled, it is to be noted that it belongs to a simple design change to a person skilled in the art to make a modification such that a preset number of (a minimum number of) pumping units perform pumping operations when the power-up signal pwrup is enabled before the mode register set signal MRS is enabled.

The voltage generation circuit of a semiconductor memory apparatus in accordance with an embodiment may be configured such that a minimum number of standby pumping units perform pumping operations when the power-up signal pwrup is enabled before the mode register set signal MRS is enabled, an increased number of standby pumping units that is larger than the minimum number perform pumping operations after the mode register set signal MRS is enabled, and all standby pumping units and an active pumping unit perform pumping operations when the active signal ACT is enabled after the mode register set signal MRS is enabled.

Therefore, in the voltage generation circuit of a semiconductor memory apparatus in accordance with an embodiment, a minimum number of standby pumping units perform pumping operations and generate pumping voltages after the power-up signal pwrup is enabled before the mode register set signal MRS is enabled. Thus, in the transistor configured as illustrated in FIG. 1, a coupling characteristic between the drain applied with the pumping voltage VPP and the back bias terminal applied with the negative voltage VBB (a characteristic that the level of the negative voltage VBB rises due to rise of the pumping voltage VPP) may be suppressed, whereby the leakage current of the transistor may be reduced.

As a consequence, in the voltage generation circuit of a semiconductor memory apparatus in accordance with an embodiment, the leakage current of a transistor may be reduced and current consumption of a semiconductor memory apparatus may be decreased. Further, as a characteristic that the level of the negative voltage VBB rises due to coupling with the pumping voltage VPP is suppressed, an amount of current needed to generate the negative voltage VBB may be decreased.

While various embodiments have been described above, it will be understood to those skilled in the art that the embodiments described are by way of example only. Accordingly, the voltage generation circuit of a semiconductor memory apparatus described herein should not be limited based on the described embodiments.

What is claimed is:

1. A voltage generation circuit of a semiconductor memory apparatus, comprising:
    a plurality of pumping units configured to provide voltages to an output node;
    a sensing unit configured to sense a voltage level of the output node and generate a pumping enable signal;
    an oscillator configured to generate an oscillator signal in response to the pumping enable signal; and
    a control unit configured to selectively output the oscillator signal to the plurality of pumping units in response to an active signal, a power-up signal, and a mode register set signal.

2. The voltage generation circuit according to claim 1, wherein the control unit outputs the oscillator signal to a preset number of pumping units when the power-up signal is enabled, and outputs the oscillator signal to all the plurality of pumping units when the active signal is enabled.

3. The voltage generation circuit according to claim 2, wherein the control unit outputs the oscillator signal to an increased number of pumping units that is larger than the preset number when the mode register set signal is enabled.

* * * * *